United States Patent
Kilmer et al.

(10) Patent No.: US 6,617,508 B2
(45) Date of Patent: *Sep. 9, 2003

(54) SOLAR CELL HAVING A FRONT-MOUNTED BYPASS DIODE

(75) Inventors: Louis C. Kilmer, Manhattan Beach, CA (US); Mark DeWitt, Simi Valley, CA (US); James Patrick Hanley, Simi Valley, CA (US); Peng-Kuen Chiang, Northridge, CA (US)

(73) Assignee: Emcore Corporation, Somerset, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/953,838

(22) Filed: Sep. 17, 2001

(65) Prior Publication Data

US 2002/0144724 A1 Oct. 10, 2002

Related U.S. Application Data

(63) Continuation of application No. 09/605,962, filed on Jun. 28, 2000, now Pat. No. 6,326,540, which is a continuation of application No. 09/137,029, filed on Aug. 20, 1998, now Pat. No. 6,103,970.

(51) Int. Cl.$^7$ .............................................. H01L 31/00
(52) U.S. Cl. ..................... 136/252; 136/256; 136/261; 136/263; 136/293; 438/66; 438/73; 438/98; 438/751

(58) Field of Search ................................. 136/256, 261, 136/263, 293; 438/66, 73, 98, 757

(56) References Cited

U.S. PATENT DOCUMENTS

| 3,887,935 A | 6/1975 | Fischer et al. |
|---|---|---|
| 3,899,689 A | 8/1975 | Baker |
| 3,912,539 A | 10/1975 | Magee |

(List continued on next page.)

FOREIGN PATENT DOCUMENTS

WO     WO 96/18213     6/1996

*Primary Examiner*—Mark A. Chapman
(74) *Attorney, Agent, or Firm*—White & Case LLP

(57) ABSTRACT

An efficient method of interconnecting a solar cell having at least two front surface contacts with a diode mounted on a front surface of the solar cell includes the act of forming at least a first recess on a front surface of the solar cell. A first solar cell contact is formed on the front surface in the first recess. A second solar cell contact is formed on the front surface. At least a first bypass diode is positioned at least partly within the recess. The bypass diode has a first diode contact and a second diode contact. The first solar cell contact is interconnected with the first diode contact. The second solar cell contact is interconnected with the second diode contact.

7 Claims, 8 Drawing Sheets

U.S. PATENT DOCUMENTS

| | | |
|---|---|---|
| 3,956,765 A | 5/1976 | Fischer et al. |
| 4,133,698 A | 1/1979 | Chiang et al. |
| 4,195,621 A | 4/1980 | Firebaugh |
| 4,281,278 A | 7/1981 | Bilsky et al. |
| 4,323,719 A | 4/1982 | Green |
| 4,367,365 A | 1/1983 | Spencer |
| 4,481,378 A | 11/1984 | Lesk |
| 4,567,316 A | 1/1986 | Hollaus et al. |
| 4,577,051 A | 3/1986 | Hartman |
| 4,612,408 A | 9/1986 | Moddel et al. |
| 4,759,803 A | 7/1988 | Cohen |
| 4,771,017 A | 9/1988 | Tobin et al. |
| 4,776,893 A | 10/1988 | McLeod et al. |
| 4,824,489 A | 4/1989 | Cogan et al. |
| 4,933,022 A | 6/1990 | Swanson |
| 4,999,524 A | 3/1991 | Williams et al. |
| 5,009,720 A | 4/1991 | Hokuyo et al. |
| 5,043,024 A | 8/1991 | Cammerer et al. |
| 5,131,341 A | 7/1992 | Newman |
| 5,138,403 A | 8/1992 | Spitzer |
| 5,223,043 A | 6/1993 | Olson et al. |
| 5,248,346 A | 9/1993 | Fraas et al. |
| 5,330,583 A | 7/1994 | Asai et al. |
| 5,330,584 A | 7/1994 | Saga et al. |
| 5,389,158 A | 2/1995 | Fraas et al. |
| 5,391,235 A | 2/1995 | Inoue |
| 5,498,297 A | 3/1996 | O'Neill et al. |
| 5,514,223 A | 5/1996 | Vogeli |
| 5,616,185 A | 4/1997 | Kukulka |
| 5,684,385 A | 11/1997 | Guyonneau et al. |
| 6,103,970 A * | 8/2000 | Kilmer et al. ............... 136/252 |
| 6,326,540 B1 * | 12/2001 | Kilmer et al. ............... 136/252 |

* cited by examiner

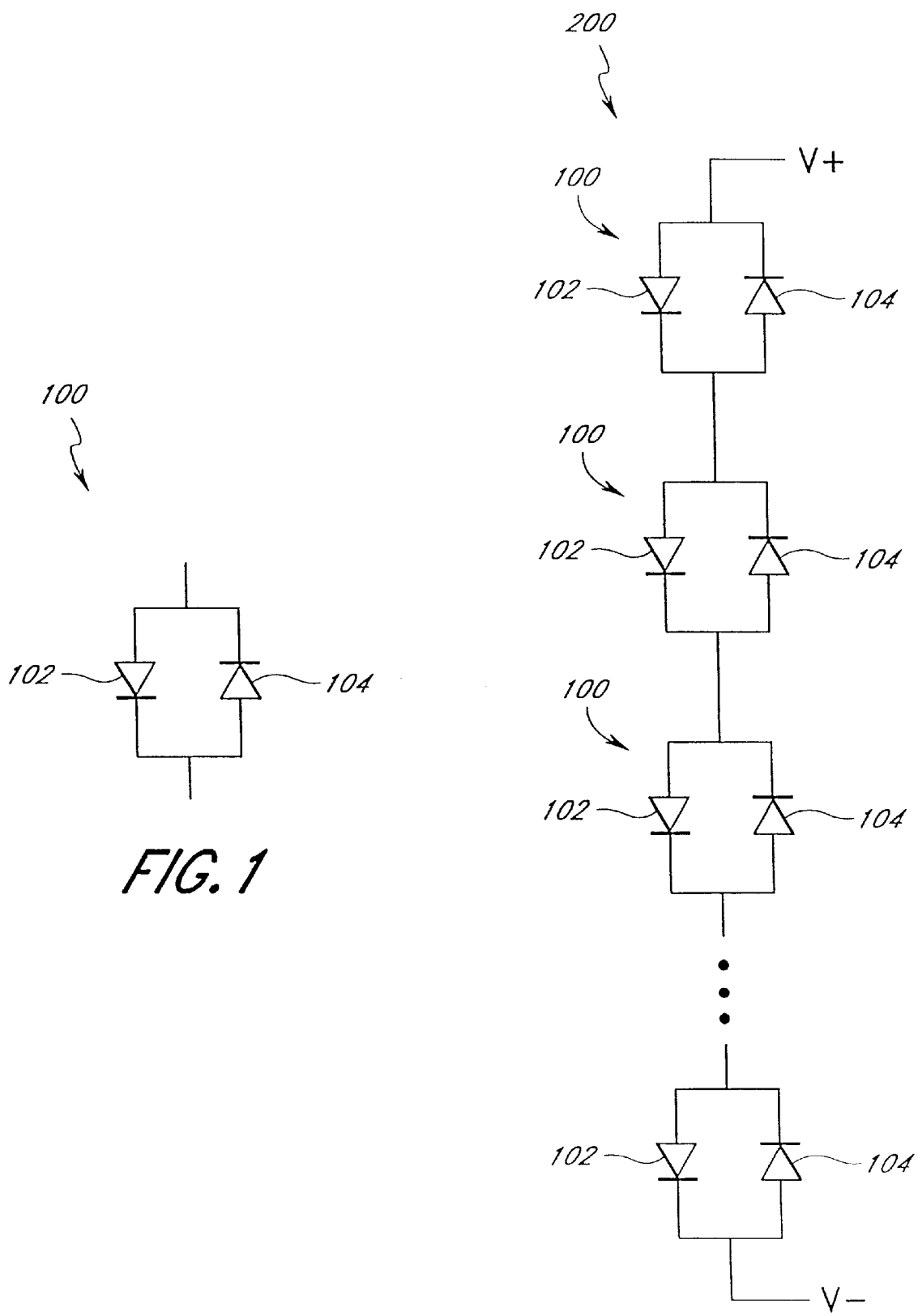

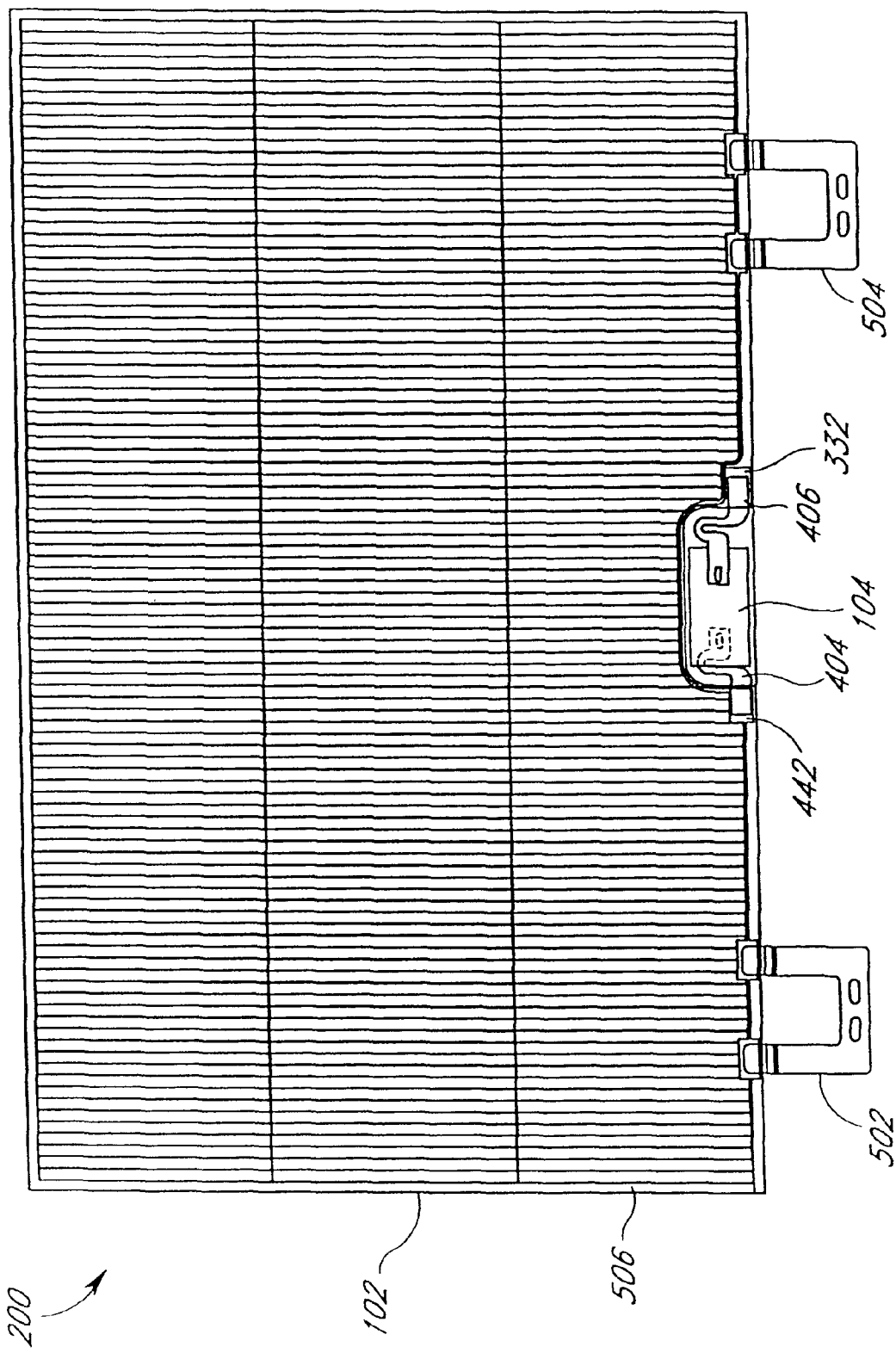

SOLAR CELL HAVING A FRONT-MOUNTED BYPASS DIODE

Cross Reference to Related Applications

This application is a continuation of application Ser. No. 09/605,962, filed on Jun. 28, 2000, now U.S. Pat. No. 6,326,540 which is a continuation of application Ser. No. 09/137,029, filed on Aug. 20, 1998, now U.S. Pat. No. 6,103,970, issued on Aug. 15, 2000.

BACKGROUND OF THE INVENTION

1. Field of the Invention

The present invention relates to solar cells. In particular, the present invention relates to methods and apparatuses for mounting a diode on a solar cell.

2. Description of the Related Art

Photovoltaic cells, commonly called solar cells, are well-known devices which convert solar energy into electrical energy. Solar cells have long been used to generate electrical power in both terrestrial and space applications. Solar cells offer several advantages over more conventional power sources. For example, solar cells offer a clean method for generating electricity. Furthermore, solar cells do not have to be replenished with fossil fuels. Instead, solar cells are powered by the virtually limitless energy of the sun. However, the use of solar cells has been limited because solar cells are a relatively expensive method of generating electricity. Nonetheless, the solar cell is an attractive device for generating energy in space, where low-cost conventional power sources are unavailable.

Solar cells are typically assembled into arrays of solar cells connected together in series, or in parallel, or in a series-parallel combination. The number of cells in an array, as well as the array topology, is at least in part determined by the desired output voltage and current.

As is well-known in the art, when all cells in an array are illuminated, each cell will be forward biased. However, if one or more of the cells is shadowed (i.e., not illuminated), such as by a satellite antenna, the shadowed cell or cells may become reversed biased because of the voltage generated by the unshadowed cells. Reverse biasing of a cell can cause permanent degradation in cell performance or even complete cell failure. To guard against such damage, it is customary to provide protective bypass diodes. One bypass diode may be connected across several cells, or, for enhanced reliability, each cell may have its own bypass diode. Multijunction solar cells are particularly susceptible to damage when subjected to a reverse bias condition. Thus, multijunction cells in particular benefit from having one bypass diode per cell. Typically, a bypass diode is connected in an anti-parallel configuration, with the anode and the cathode of the bypass diode respectively connected to the cathode and the anode of the solar cell, so that the bypass diode will be reversed biased when the cells are illuminated. When a cell is shadowed, current through the shadowed cell becomes limited and the shadowed cell becomes reverse biased. The bypass diode connected across the shadowed cell in turn becomes forward biased. Current will flow through the bypass diode rather than through the shadowed cell, thereby allowing current to continue flowing through the array. In addition, the bypass diode limits the reverse bias voltage across the shadowed cell, thereby protecting the shadowed cell.

Several different prior art methods have been used to provide solar cells with bypass diode protection. Each prior art method has its drawbacks. For example, in an attempt to provide increased bypass protection, one method involves locating a bypass diode between adjacent cells, with the anode of the bypass diode connected to one cell and the cathode of the diode connected to an adjoining cell. However, this technique requires that the cells be assembled into an array before the bypass diode protection can be added. This assembly method is difficult and inefficient. Furthermore, this technique requires the bypass diodes to be added by the array assemble rather than by the cell manufacturer. In addition, this technique requires the cells to be spaced far enough apart so as to accommodate the bypass diode. This spacing results in the array having a smaller active area, and thus the array is less efficient on an area basis.

Another prior art technique providing a bypass diode for each cell requires that a recess be formed on the back of the cell in which a bypass diode is placed. Each cell is provided with a first polarity contact on a front surface of the cell and a second polarity contact is provided on a back surface of the cell. An "S" shaped interconnect must then be welded from a back surface contact of a first cell to a front surface contact of an adjoining cell. Thus, this technique disadvantageously requires the cells to be spaced far enough apart to accommodate the interconnect which must pass between the adjoining cells. In addition, rear-mounted diodes typically protrude a significant amount from the solar cell backside. Thus, when adhering the solar cell/bypass diode assembly to a panel, a very thick, heavy layer of adhesive must be applied to the solar cell/bypass diode assembly backside so that the assembly will lay flat on the panel. The added weight of the adhesive is very disadvantageous for space-based applications. Furthermore, the present prior art technique requires the connection of the interconnect to the adjoining cell to be performed by the array assembler as opposed to the cell manufacturer.

Still another prior art technique for providing a bypass diode involves mounting a bypass diode on the front of a solar cell, with one diode contact connected to a contact on the back of the solar cell using a discrete C-clamp type interconnect and one diode contact connected to a contact on the front of the solar cell. This technique requires flipping the solar cell from front to back to weld or solder the interconnections to the front and back solar cell contacts. The flipping process often damages the cell, greatly reducing manufacturing yields. Furthermore, this technique disadvantageously requires adjoining cells to be spaced far enough apart to accommodate the C-clamp type interconnects which must pass between the adjoining cells.

SUMMARY OF THE INVENTION

One embodiment of the present invention advantageously provides a method and system for efficiently and compactly mounting a bypass diode to the front of a solar cell. In one embodiment, the bypass diode is electrically connected to two contacts on the front of the solar cell, thereby eliminating the prior art manufacturing step of flipping the solar cell from front to back to interconnect the bypass diode to a contact on the back of the solar cell. Furthermore, the novel solar cell/bypass diode combination optionally permits all bypass diode connections to be made to the solar cell on which the diode is mounted, eliminating the need to connect one diode to a contact of an adjoining cell. Thus, having all solar cell-bypass diode interconnections on the front or top side improves throughput in the interconnection processing, increases manufacturing yields through reduced handling, and reduces attrition.

One embodiment of the present invention is an efficient method of interconnecting a solar cell having at least two front surface contacts with a diode mounted on a front surface of the solar cell. The method includes the act of forming at least a first recess on a front surface of the solar cell. A first solar cell contact is formed on the front surface in the first recess. A second solar cell contact is formed on the front surface. At least a first bypass diode is positioned at least partly within the recess. The bypass diode has a first diode contact and a second diode contact. The first solar cell contact is interconnected with the first diode contact. The second solar cell contact is interconnected with the second diode contact.

BRIEF DESCRIPTION OF THE DRAWINGS

These and other aspects, advantages, and novel features of the invention will become apparent upon reading the following detailed description and upon reference to accompanying drawings in which:

FIG. 1 is a schematic of one embodiment of a solar cell interconnected with a bypass diode;

FIG. 2 illustrates one embodiment of an array of solar cells;

FIG. 5 illustrates a top plan view of one embodiment of a solar cell with a front-mounted bypass diode;

DETAILED DESCRIPTION OF THE PREFERRED EMBODIMENT

Figure 3:
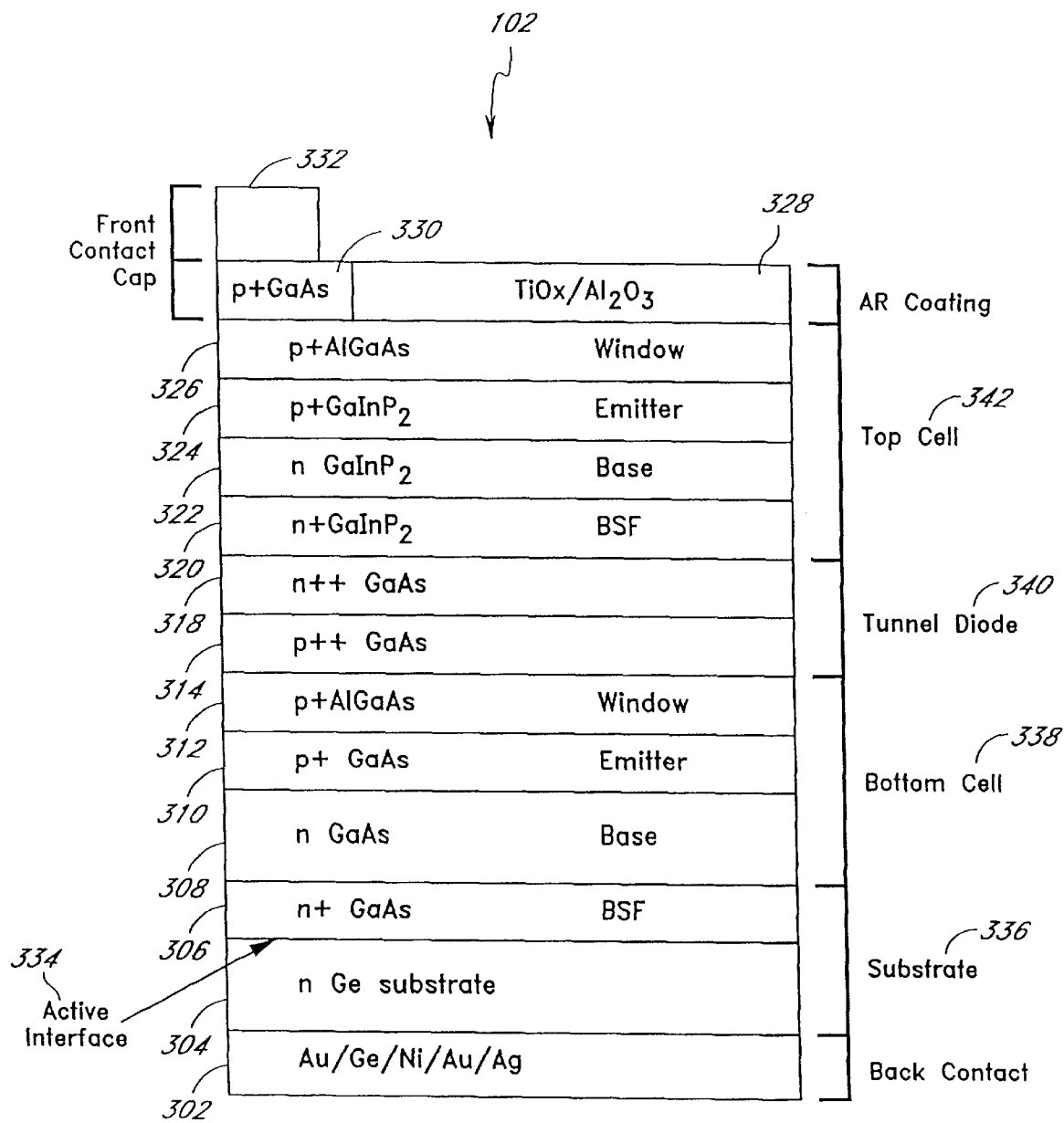
FIG. 3 illustrates a first embodiment of a solar cell cross-section.

As described below, one embodiment of the present invention advantageously provides novel systems and methods for efficiently and compactly mounting a bypass diode to the front of a solar cell.

FIG. 1 illustrates a schematic of one embodiment of a solar cell 102 interconnected with a bypass diode 104 to form a single solar cell/bypass diode assembly 100. The bypass diode 104 is connected in an anti-parallel configuration in relation to the solar cell 102. When multiple solar cell/bypass assembles 100 are connected in series as part of array 200, as illustrated in FIG. 2, a corresponding bypass diode 104 is reverse biased when the associated solar cell 102 is illuminated. When a cell 102 within the array 200 becomes shadowed, the cell 102 may have a reduced current flow, and may even stop conducting current entirely. If the surrounding cells are illuminated and are generating respective voltages, the shadowed cell 102 may become reversed biased. The bypass diode, however, will become forward biased, allowing current flowing through the array 200 to flow through the bypass diode 104, thus bypassing the shadowed cell 102. In one embodiment, at least one of the solar cells 102 is Gallium Arsenide (GaAs) based. GaAs cells offer significant performance advantageous over silicon-type cells in many space-based applications. For example, GaAs-type cells are more efficient, and thus can generate more power for a given area and weight. Weight and area are at a premium in space applications, therefore it is highly desirable to reduce both. Furthermore, GaAs-type cells are more resistant to space radiation. In addition, the cell 102 may optionally be a multijunction solar cell, having two, three, four or more junctions, which may be even more efficient than single junction cells. However, GaAs and multijunction cells are more susceptible to damage from reverse-bias conditions than some other types of cells, such as silicon-type solar cells.

FIG. 3 illustrates one embodiment of a $GaInP_2/GaAs$ solar cell 102 cross-section before the cell 102 is processed to receive the bypass diode 104. In the illustrated embodiment, the cell 102 has a cross-sectional area of 1.57 inches×2.36 inches. In another embodiment, the cell 102 has a cross-sectional area of 3.94 inches×3.94 inches. In one embodiment, the layers which make up the solar cell 102 are grown sequentially. A back contact 302 is formed from Au/Ge/Ni/Au/Ag. In an alternative embodiment, the back contact is formed from Ti/Pd/Ag. The back contact 302 is coupled to an n-type Germanium (Ge) substrate 336. In one embodiment, the substrate 336 includes an n-type GaAs interface defect buffer layer 306 grown on an n-type Ge wafer 304. It is understood that the term layer may refer to either an actual layer or an interface between two layers. In one embodiment, the buffer layer 306 is of sufficient thickness to ensure near defect-free subsequent layers. The buffer layer 306 also serves as a source of an active GaAs/Ge interface 334. In another embodiment, the layer 306 may be formed from other materials, including, by way of example, $n^+$-$GaInP_2$ or $n^+$-AlGaAs. A GaAs bottom cell 338 is formed on top of the substrate 336. The bottom cell 338 includes an n-type GaAs base 308, followed by a $p^+$-type GaAs emitter 310, which is followed by a $p^+$-type AlGaAs window 312. In one embodiment, the bottom cell 338 responds to light in at least the 0.67–0.90 $\mu$m wavelength range, though the bottom cell 338 can be configured to respond to other ranges as well.

A heavily doped $n^{++}/p^{++}$ GaAs tunnel diode 340 is formed on top of the bottom cell 338. The tunnel diode 340 is formed from a heavily doped $p^{++}$-type GaAs layer 314 overlaid by a heavily doped $n^{++}$-type GaAs layer 318. The tunnel diode 340 electrically connects the GaAs bottom cell 338 to a $GaInP_2$ top cell 342. The top cell 342 includes a n-type $GaInP_2$ back surface field (BSF) layer 320, followed by an n-type $GaInP_2$ base 322, followed by a $p^+$-type emitter 324. The emitter 324 is overlaid by a $p^+$-type AlGaAs window 326. In one embodiment, the top cell 342 responds to light in at least the 0.35–0.67 $\mu$m wavelength range, though the top cell 342 can be configured to respond to other ranges as well. An optional dual layer antireflection coating 328 of $TiO_x$ and $Al_2O_3$ may be applied over the window 326. A front contact 332 of Ti/Pd/Ag metal is formed on top of a $p^+$-type GaAs layer cap 330. In one embodiment, the front contact pad has an area of approximately 0.055 inches+0.08 inches.

Figure 6:
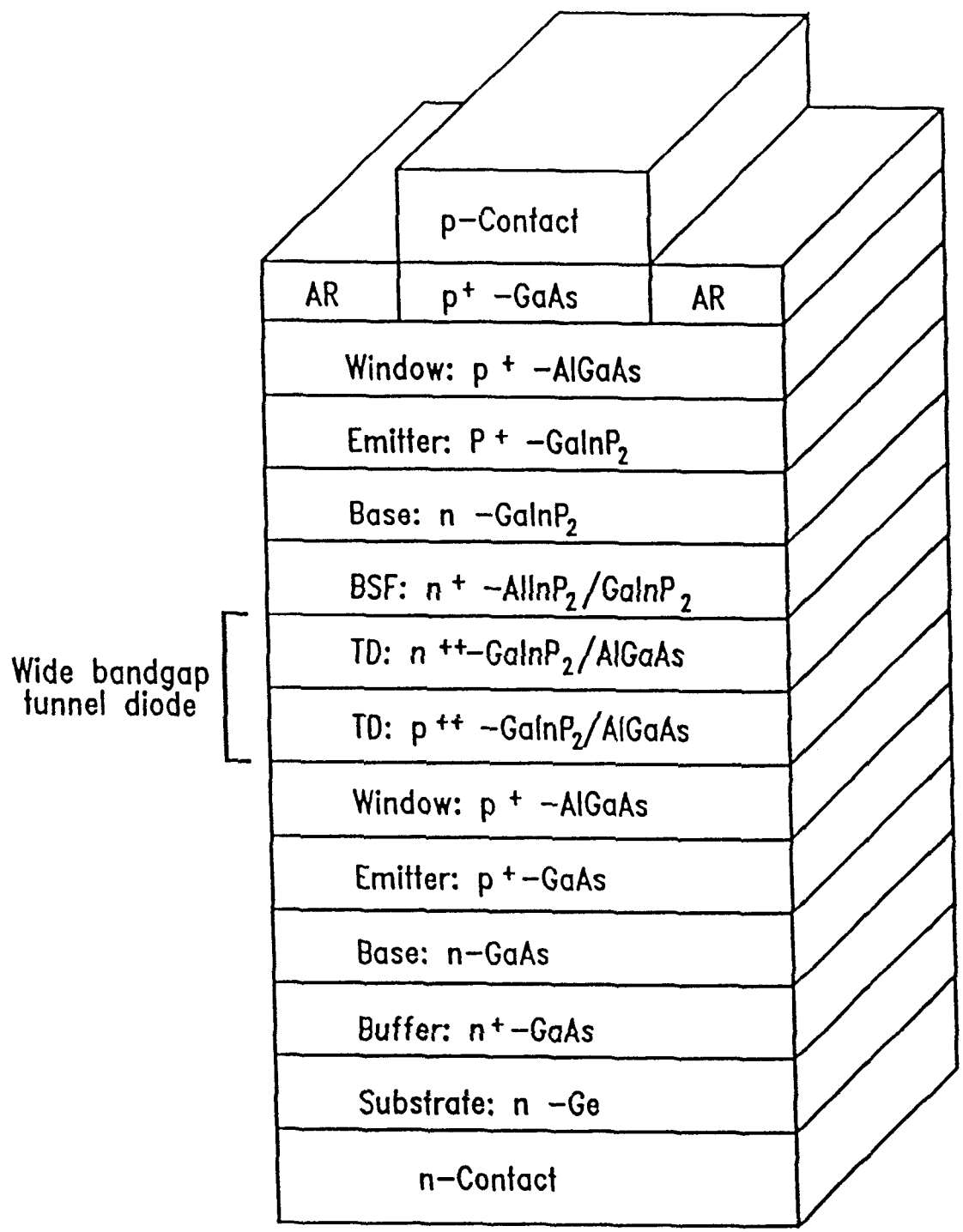
FIG. 6 illustrates a second embodiment of a solar cell cross-section.

As will be understood by one skilled in the art, the cross-section illustrated in FIG. 3 and described above is for illustrative purposes, and other combinations of materials and layers may be used as well, as is illustrated in FIG. 6. FIG. 6 illustrates a cell having a wide bandgap tunnel diode. Furthermore, for example, a p-type Ge wafer or Group III-V material may be used in place of the n-type Ge wafer of the present embodiment. In another embodiment, the solar cell has four or more junctions. Furthermore, the antireflection coating may be a single layer coating, a triple layer coating, or have still other layers, or may not be used at all.

Figure 4A:
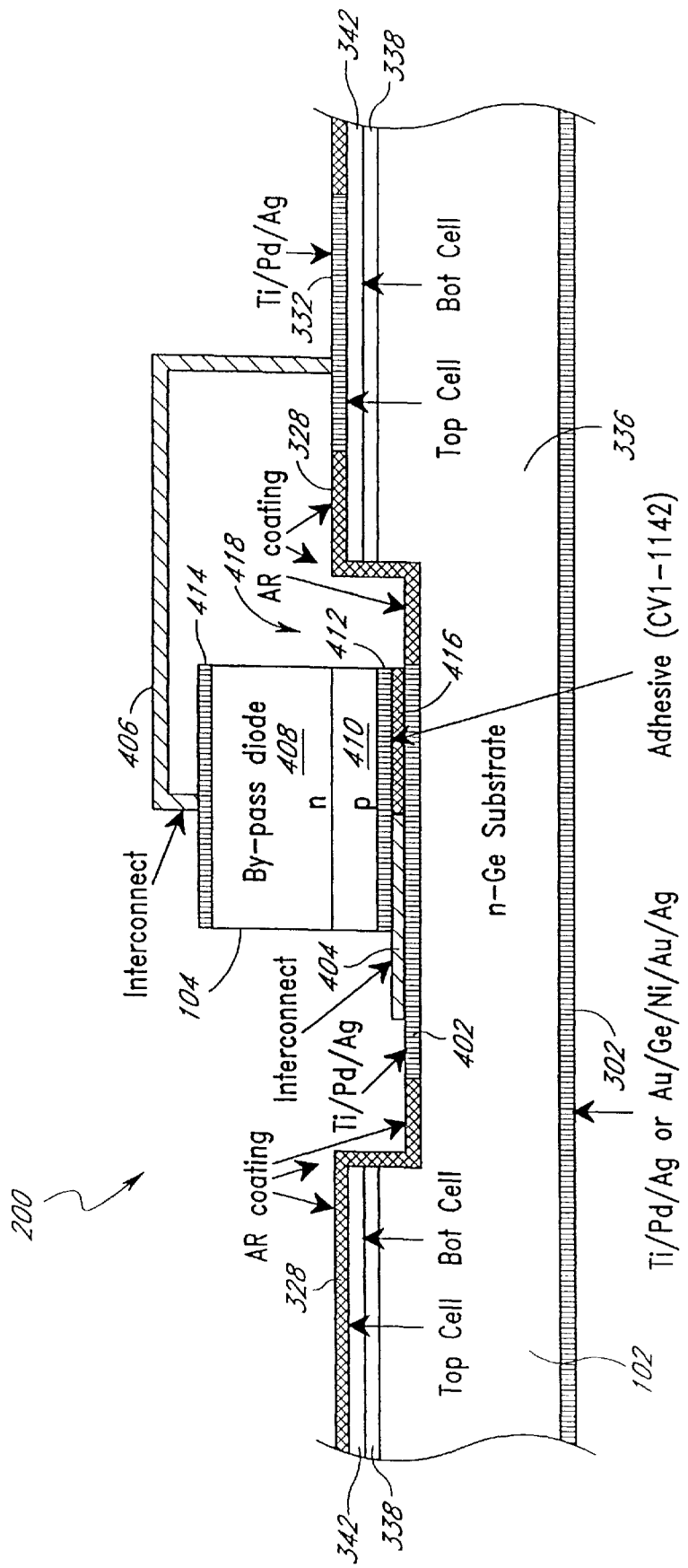
FIG. 4A illustrates a schematic of one embodiment of a solar cell cross-section with a front-mounted bypass diode.
Figure 4B:
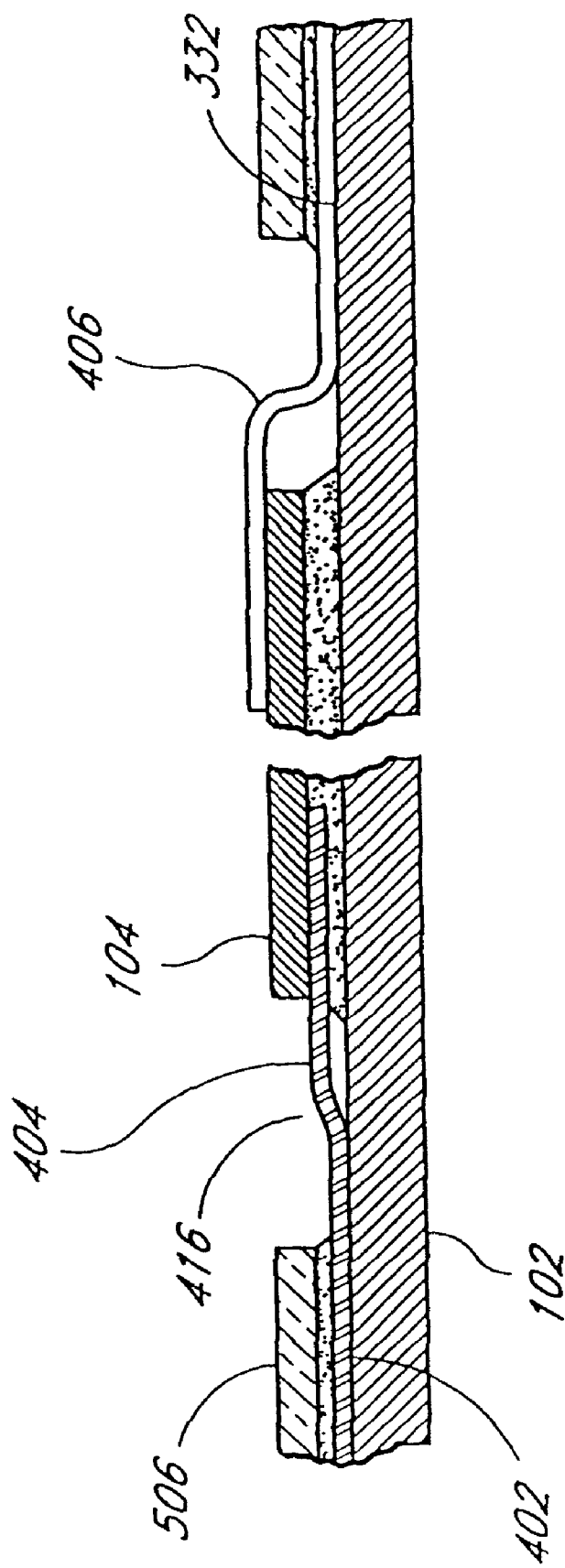
FIG. 4B illustrates one embodiment of the physical construction of the solar cell cross-section illustrated in FIG. 4A.

FIGS. 4A and 4B illustrate one embodiment of a solar cell cross-section with a front-mounted bypass diode 104. FIG.

5 illustrates a top plan view of one embodiment of the solar cell 102 with the front-mounted bypass diode 104. The cross-section of the solar cell 102 in FIGS. 4A and 4B is a less detailed cross-section than that illustrated in FIG. 3 to highlight the portions processed to receive the bypass diode 104. In one embodiment, the bypass diode 104 is a discrete silicon diode. In another embodiment, the bypass diode 104 is a germanium diode. Other diode types may be used in alternative embodiments.

The assembly 200 includes the solar cell 102 optionally having at least one recess or depression 418 into which at least one diode 104 is mounted. As described below, in another embodiment, the front mounted diode is not placed in a recess. In one embodiment, the diode is approximately 0.120 inches deep and 0.250 inches wide. The recess is generally rectangular, 0.152 inches deep and 0.382 inches wide, thus having an area of approximately 0.22 inches$^2$. It is understood that the specific size and shape of the diode 104 and the recess 418 are not critical, but should preferably allow for an efficient solar cell. For example, in one embodiment, the recess 418 may have a generally cylindrical shape. In another embodiment, the recess 418 may have a polygonal shape with three or more sides. Furthermore, in another embodiment, the diode 104 is not mounted in the recess 418. Instead, the diode 104 may be mounted anywhere on the front surface of the solar cell 102, with the recess 418 providing access to a lower cell layer.

Figure 7A:
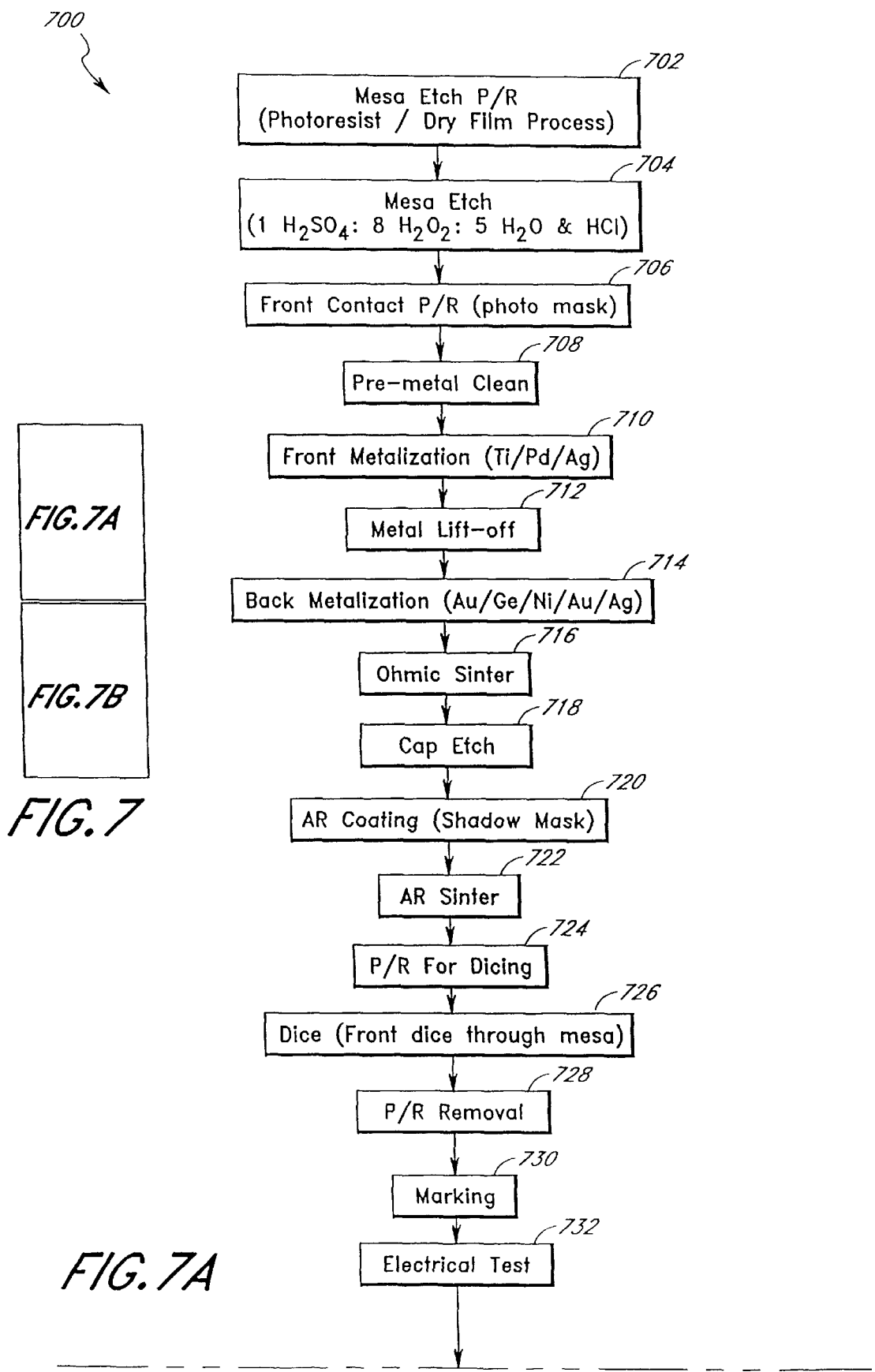
FIGS. 7A and 7B illustrate one method of fabricating the solar cell having the front-mounted bypass diode.
Figure 7B:
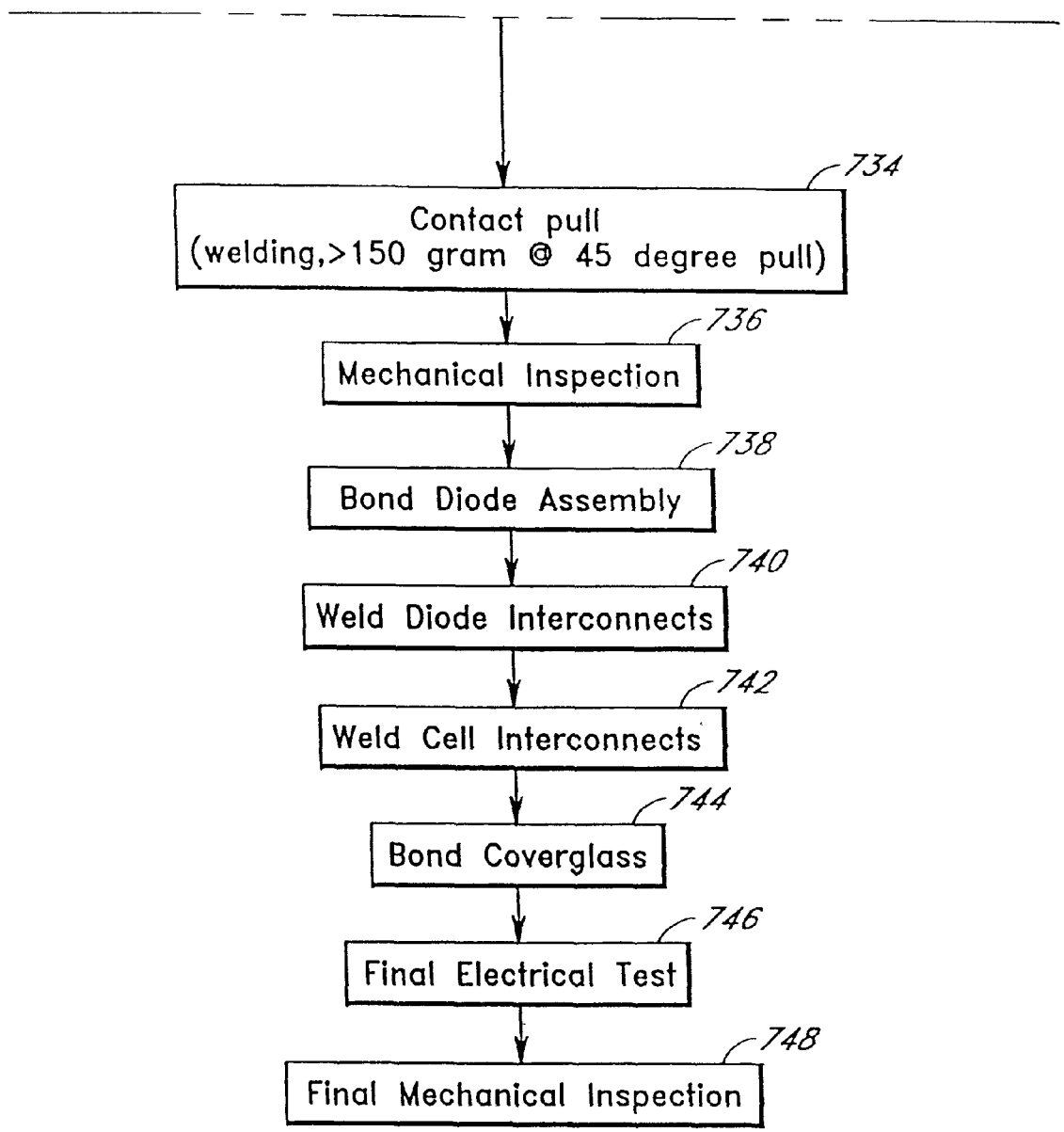

FIGS. 7A and 7B illustrate one method of processing a cell 700, including the steps of forming a recess for mounting a diode, forming contacts, applying antireflection coating, dicing, and other steps. In one embodiment, a mesa etch process 702, 704 is used form the recess 418 down to a bottom-most layer, such as the surface of the n-type Ge substrate 336. In another embodiment, the recess extends down to an interface layer. The mesa etch process 702, 704 uses photoresist patterning and wet chemical etching using a mixture of $H_2SO_4$ and $H_2O_2$ for the GaAs cap 330 and the bottom cell 338, and HCl and $H_2O$ for the $GaInP_2$ top cell 342. Other techniques, such as a microblasting process or an ion implantation process, may also be used to form the recess 418.

Following the mesa etch process, a photoresist patterning process 706 is repeated for the front metal contacts 332, 402. A pre-metal clean step 708 and a front metalization step 710 are then performed. Next a lift-off or a metal etch technique 712 is applied. The solar cell back metallization is then deposited to the Ge substrate 336 to form the back contact 302 at a step 714. At a step 716, the ohmic contacts 3302, 332, 402 are sintered in a forming gas, such as a nitrogen-hydrogen gas, using a furnace tube. Following the sintering, the cell cap layer 330 is etched at a step 718, and the dual layer anti-reflection (AR) coating 328 is applied at a step 720. The AR coating is sintered at a step 722. Photoresist is applied in preparation for dicing at a step 724. The cell 102 may be diced to an appropriate size at a step 726. The photoresist is then removed at a step 728.

Following the photoresist step is a marking step 730, an electrical test step 732, a contact pull step 734, and an intermediate mechanical inspection step 736.

In one embodiment, the interconnects 404, 406 are first bonded to the diode 104. The interconnects 404, 406 may be formed from a variety of materials, such as, by way of example, silver or silver-plated Invar. As illustrated in FIG. 5, in one embodiment the interconnects 404, 406 are serpentine shaped so as to provide stress relief. The diode 104 may then be mounted in the recess 418. An adhesive 416 is used to bond the diode 104 to the cell 102 at a step 738. A variety of adhesive types may be used, including, but not limited to, a silicone-type adhesive, an EVA-type adhesive, such as CV-1142 or CV-2943, or a conductive-type adhesive. In one embodiment, use of a conductive-type adhesive improves thermal conductivity as well as providing for electrical contact to the solar cell. Thus, use of the conductive-type adhesive eliminates the need for the bottom "S" type interconnect from the diode 104 to the solar cell 102. Once the diode 104 is bonded to the cell 102, the interconnects 404, 406 are then welded, soldered, or otherwise physically bonded to top and bottom diode contacts 412, 414 at a step 740. In an alternative embodiment, metal interconnects 404, 406 are first welded, soldered, or otherwise physically bonded to the cell contacts 332, 402, and then are connected to the diode 104. FIG. 4B illustrates one embodiment of the physical construction of the solar cell cross-section illustrated in FIG. 4A.

As illustrated in FIG. 5, in one embodiment, two tabs 502, 504 are mounted on the solar cell/diode assembly 200 at a step 742 for interconnection to an adjoining assembly. The tabs 502, 504 may be U-shaped. A first side of each the tabs 502, 504 is connected to an anode of the cell 102. The solar cell/diode assembly 200 is interconnected to a second solar cell/diode assembly by connecting a second side of the tabs 502, 504 to a cathode of the second solar cell/diode assembly. In one embodiment, the tabs are formed from silver, silver-Invar, or silver-clad moly materials.

A cover 506, as illustrated in FIG. 5, may be bonded to the front of the cell 102 using an adhesive at a step 744. In one embodiment, the adhesive is a substantially transparent silicone-type adhesive, nominally 50 $\mu$m thick. For space applications, the adhesive provides a space qualified non-darkening resilient interface between the solar cell 102 and the cover 506. In the illustrated embodiment, the cover 506 is a coverglass notched to accommodate the diode 104. In one embodiment, where the solar cell/diode assembly 200 is intended for space applications, a ceria-doped borosilicate coverglass may be used. In one embodiment, the coverglass 506 may have a thickness within a range of 50 $\mu$m to 1500 $\mu$m. The ceria-doped coverglass provides radiation resistant shielding for charged and uncharged particles. In one embodiment, the coverglass will remain substantially transparent when exposed to an AM0 space radiation environment spectrum (the spectrum found at Earth's orbit around the sun, outside of Earth's atmosphere). One skilled in the art will understand that other suitable coverglass materials and dimensions can be used as well.

Once the cover 506 is bonded to the cell 102, a final electrical test may be performed at a step 746, followed by a final mechanical inspection at a step 748.

A summary of one embodiment of the solar cell/diode assembly's characteristics is found in Table 1, below.

TABLE 1

| Cell Characteristics | |
| --- | --- |
| AR Coating | $TiOx/Al_2O_3$ |
| P Contact | Ti/Pd/Ag |
| N Contact | Au/Ge/Ni/Au/Ag |
| Welded Contact Pull Strength | 150 gm @ 45 degree Pull |
| Cell Thickness | 160 $\mu$m |
| Cell Weight | 2.06 g (not including bypass diode) |
| Cell Size | 38.456 mm × 63.221 mm |

TABLE 1-continued

Cell Characteristics

| Bare Cell Electrical Output @ BOL | Voc = 2.44 V |
| --- | --- |
| | Isc = 362.25 mA |
| | Vmp = 2.11 V |
| | Imp = 335.02 mA |
| | Efficiency = 21.5% |
| BOL Temperature Coefficient @ BOL | $dVoc/dt = -5.9$ mV/° C. |
| | $dIsc/dt = +0.04$ $\mu A$/° C.-mm$^2$ |
| | $dVmp/dt = -5.8$ mV/° C. |
| | $dImp/dt = +0.04$ $\mu A$/° C.-mm$^2$ |
| | $dEff/dt = -0.222\%$/° C. |
| Optical Properties | AR coverglass (absorptance: 0.91, emittance: 0.88) |
| | UVR coverglass (absorptance: 0.87, emittance: 0.86) |

In an alternative embodiment, both front solar cell contacts 332, 402 may be located within the front recess 418. This approach eliminates having the interconnect 406 protrude outside of the cross-sectional area of the recess 418. In another embodiment, both diode contacts 412, 414, are located on the bottom of the diode 104 and both front solar cell contacts 332, 402 are located within the front recess 418. A number of techniques may be used to place both diode contacts on the diode bottom. For example, a wraparound contact connected to the n-doped diode layer and the diode bottom may be used to allow an electrical connection to the n-doped diode layer via the diode bottom. The wraparound contact is insulated from the p-doped diode layer. If a low profile-type diode is used such that the diode 104 does not protrude above the recess walls, then a standard non-notched coverglass may be used, further reducing costs. The standard non-notched coverglass may be sized and positioned to overlay substantially the entire solar cell surface, including the diode 104.

In the case of a multijunction solar cell, by extending the recess to an appropriate junction layer or interface, the diode may be appropriately interconnected to only protect a selected number of the junctions. Thus, in the case of a dual-junction cell, by etching the recess down to a intervening layer, only one junction is protected. Alternatively, by etching down to the substrate or other appropriate layer, both junctions are protected. This is in contrast to the prior art techniques, which interconnect a diode contact to a contact on the cell backside using a C-clamp, and thus is restricted to protected all the cell junctions.

In another embodiment (not shown), the diode 104 is mounted on a non-recessed portion of the solar cell front surface. In one embodiment, the diode 104 is then interconnected to an appropriate cell layer or interface by routing an interconnect from the diode 104 to the appropriate cell layer or interface via a recess extending from the cell surface to the cell layer or interface. In another embodiment, the diode 104 is partly mounted on a non-recessed portion of the solar cell surface, with a portion of the diode 104 extending over a cell recess. In one embodiment, the portion of the diode 104 extending over the cell recess has a contact on a diode backside. As discussed above, an interconnect is routed from the diode contract to the appropriate cell layer or interface.

In still another embodiment, the diode is interconnected to two solar cell contracts formed on a non-recessed portion of the cell front surface.

In one embodiment, the use of a front-mounted diode deposited in a solar cell recess and interconnected with the solar cell's front contacts, advantageously reduces the cell efficiency by only 1.8% or less as compared with a bare solar cell lacking the recess. In another, less efficient embodiment, the cell efficiency is reduced by 2.5% or less as compared with a bare solar cell lacking the recess. Thus, in one embodiment, adding the front-mounted diode 104 to an efficient GaAs solar cell 102 having a bare cell efficiency of 23% will only slightly reduce the cell efficiency to 22.6%. In another embodiment, the solar cell 102 is intended for use in a concentrator assembly. Typically, under concentration, solar cells produce higher currents, and therefore, the bypass diode is typically made larger to maintain an acceptable current density. In one such embodiment, adding the front-mounted diode 104 to multijunction solar cells having a bare cell efficiency of 23% only reduces the cell efficiency to 22.4%

While certain preferred embodiments of the invention have been described, these embodiments have been presented by way of example only, and are not intended to limit the scope of the present invention. Accordingly, the breadth and scope of the present invention should be defined only in accordance with the following claims and their equivalents.

What is claimed is:

1. A solar cell assembly, comprising:

a solar cell structure having a front surface and a back surface and including a plurality of semiconductor layers, the front surface being the illuminated side of the solar cell when said solar cell is in the active state;

a recess extending through the front surface of the solar cell structure down to a selected layer; and a separately attachable bypass diode electrically connected across at least a portion of the solar cell structure between the front surface of the structure and the selected layer through the recess.

2. The solar cell assembly of claim 1, wherein the bypass diode is positioned in the recess.

3. The solar cell assembly of claim 1, wherein the solar cell structure includes at least a first photovoltaic cell and a second photovoltaic cell.

4. The solar cell assembly of claim 3, wherein the first photovoltaic cell is made from a first material and the second photovoltaic cell is made from a second material different from the first material.

5. The solar cell assembly of claim 3, wherein the bypass diode is electrically connected across both the first and second photovoltaic cells.

6. The solar cell assembly claim 1, wherein the solar cell structure includes a substrate, and the recess extends to a surface of the substrate.

7. The solar cell assembly of claim 1, wherein the recess extends to an interface layer between two semiconductor layers.

* * * * *